United States Patent
Franz et al.

(10) Patent No.: US 6,452,805 B1
(45) Date of Patent: Sep. 17, 2002

(54) COMPUTER MODULE MOUNTING SYSTEM AND METHOD

(75) Inventors: Perry D. Franz, Elk Mound, WI (US); Jeffrey Mark Glanzman, Mondovi, WI (US); David R. Collins, Eau Claire, WI (US); Steve J. Dean, Chippewa Falls, WI (US); Timothy S. McCann, Altoona, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/408,148

(22) Filed: Sep. 29, 1999

(51) Int. Cl.[7] .............................. G06F 1/16; H05K 7/02
(52) U.S. Cl. .................... 361/724; 174/154; 312/223.1; 361/727; 361/799
(58) Field of Search ................................ 361/683, 686, 361/724–727, 799; 312/223.1–223.3; 174/151, 154

(56) References Cited

U.S. PATENT DOCUMENTS

| | | | | |
|---|---|---|---|---|
| 3,657,608 A | * | 4/1972 | Leone et al. ............. 312/223.1 |
| 5,049,701 A | * | 9/1991 | Vowles et al. ................. 174/35 |
| 5,165,770 A | * | 11/1992 | Hahn ...................... 312/265.4 |
| 5,209,356 A | * | 5/1993 | Chaffee ...................... 361/686 |
| 5,571,256 A | * | 11/1996 | Good et al. .................... 211/26 |
| 5,666,271 A | * | 9/1997 | Kim et al. ................... 361/726 |
| 5,761,033 A | * | 6/1998 | Wilhelm ...................... 361/686 |
| 5,896,273 A | * | 4/1999 | Varghese et al. ............. 361/724 |
| 6,016,252 A | * | 1/2000 | Pignolet et al. .............. 361/724 |
| 6,088,222 A | * | 7/2000 | Schmitt et al. ............. 361/686 |
| 6,095,345 A | * | 8/2000 | Gibbons ....................... 211/26 |
| 6,129,429 A | * | 10/2000 | Hardt et al. ............. 312/223.2 |
| 6,259,605 B1 | * | 7/2001 | Schmitt ...................... 361/727 |
| 6,279,754 B1 | * | 8/2001 | Hoss et al. .................... 211/26 |

* cited by examiner

Primary Examiner—Lynn D. Feild
(74) Attorney, Agent, or Firm—Schwegman, Lundberg, Woessner & Kluth, P.A.

(57) ABSTRACT

A rack including a rail for supporting a computer module and a grounding element electrically coupled to the rack and positioned to electrically contact a computer module inserted in the rack such that the grounding element provides a path to ground. The grounding element can be an arcuate bracket attached to the rail to make contact with a side of the computer module. The grounding element can be a conductor extending from the rack and positioned to make contact with a side of the computer module. The rack can include a wider section which provides a cabling channel and a member on the rack for mechanically coupling the rack to an adjacent rack. The rack can include at least one passage for allowing a cable to pass through the rack to an adjacent rack and a cable organizer for maintaining placement of at least one cable routed through the passage.

37 Claims, 19 Drawing Sheets

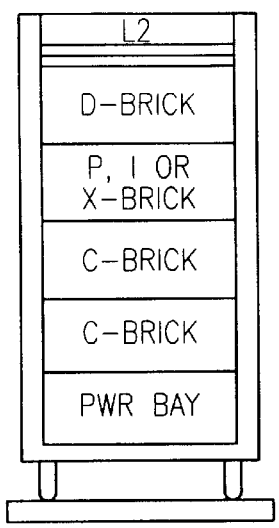
TYPICAL SYSTEM FIG. 6
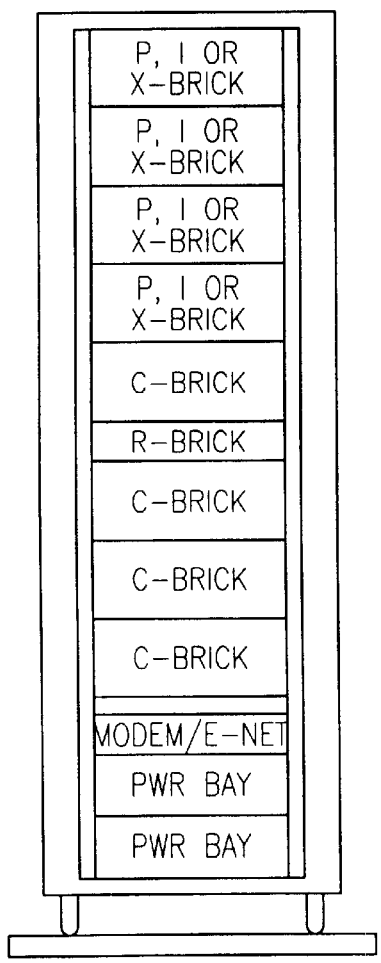
MAXIMUM CPU AND I/O FIG. 7

COMPUTER MODULE MOUNTING SYSTEM AND METHOD

FIELD OF INVENTION

This invention relates to computer hardware, and in particular to a computer module mounting system and method for a scalable computer system.

BACKGROUND

Commercial use computer systems typically include computer modules resting on a special sub-floor allowing for cable routing and grounding beneath the floor surface. In some cases, computer modules are placed in commercial computer racks resting on the sub-floor.

Industry standards dictate certain design criteria for the modules and for the racks such as a standard hole template for used in racks for supporting these computer modules. Computer modules complying with these industry standards are typically used in existing racks to build smaller scale computer systems.

Achieving higher CPU density using these building blocks is inhibited, in part, by a number of factors related to the configuration of these elements. Cables connecting these units are expensive and extensive cable connections can make a larger computer system cost prohibitive. Additionally, extensive cable connections can make the cable system difficult to manage and support. Furthermore, such cable connections also introduce greater amounts of electromagnetic interference into the system. To ameliorate this, commercial computer systems are typically grounded to a sub-floor ground grid and many commercial sites may lack a sub-floor.

Industry standards have helped to create more cost effective computer modules. Industry standards, however, do not address all of the needs of the industry including those factors related to ease of installation, service, upgrade and scalability of computer systems.

Installation, service and upgrade of a commercial computer system can be a protracted and cumbersome process. Installation may require time consuming placement of supports within the standard racks. Service can be further complicated because cables have traditionally been left unorganized; even ancillary cables must often be disconnected from the system to access a computer module or must be repositioned using ad hoc means.

Service and upgrade of commercial systems also typically requires removal of a computer module from the front of the rack after disconnection of cables. The difficulty of removing a module from the rack can be compounded by the increased weight of the element. Service and upgrade also may require disassembly of the computer module housing to access, repair or replace components internal to the module before the module is replaced within a rack.

When a computer system is scaled or reconfigured and a module is instead exchanged for another module of a different size, the supports within the rack have to be removed and reinstalled to accommodate the new module in the system. Supports are typically attached to the rack using a multi-piece fastener such as a nut and screw that must be assembled through a standard industry size aperture. Furthermore rerouting of network cables underneath sub-floor is another common requirement of commercial systems. In some cases this may require extensive removal and re-assembly of additional portions of sub-floor. New ground connections to the sub-floor ground grid may also be required.

Another problem is the lack of alignment common to these modular computer systems. Computer systems formed from these discrete units must be assembled together to make a larger system. Modules are typically difficult to align and install into the rack. The position of the module must typically be adjusted into the proper position and must be adjusted in order to be secured within the rack. Accessing portions of the computer system typically requires accessing a number of discrete modules. Modules will typically be positioned within racks providing poor access to the module. This can slow the installation, service, and upgrade processes making larger systems from these components less desirable. This is also one cause of poor field serviceability. Proper positioning, grounding and servicing of modules is often either not done, poorly done, or improperly done.

A need exists for improved computer modules and for racks providing an improved means for supporting the computer modules to improve the ease with which commercial systems are serviced, upgraded and scaled.

DISCLOSURE OF INVENTION

According to one aspect of the invention a computer module mounting system includes an improved rack having features for grounding the computer system to the rack. In another embodiment, the rack provides improved cable management. In one embodiment, the rack includes a front portion for supporting computer modules and a rear portion have a greater width use in positioning cables so that computer modules can be accessed. In another embodiment, the rack includes an improved rail and shelf support system for increasing the ease with which modules are arranged within the racks. In yet another embodiment, the rack includes passages for use in routing cables between computer modules supported in another rack. In yet another embodiment, the racks can be used to create large computer systems having routers centrally placed in order to minimize cable distances. The result is improved ease of installation, service, upgrade and scalability.

BRIEF DESCRIPTION OF DRAWINGS

FIG. 6 is a view of an embodiment of an improved rack and scalable computer system.

FIG. 7 is a view of an embodiment of an improved rack and scalable computer system.

DESCRIPTION OF EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1A:
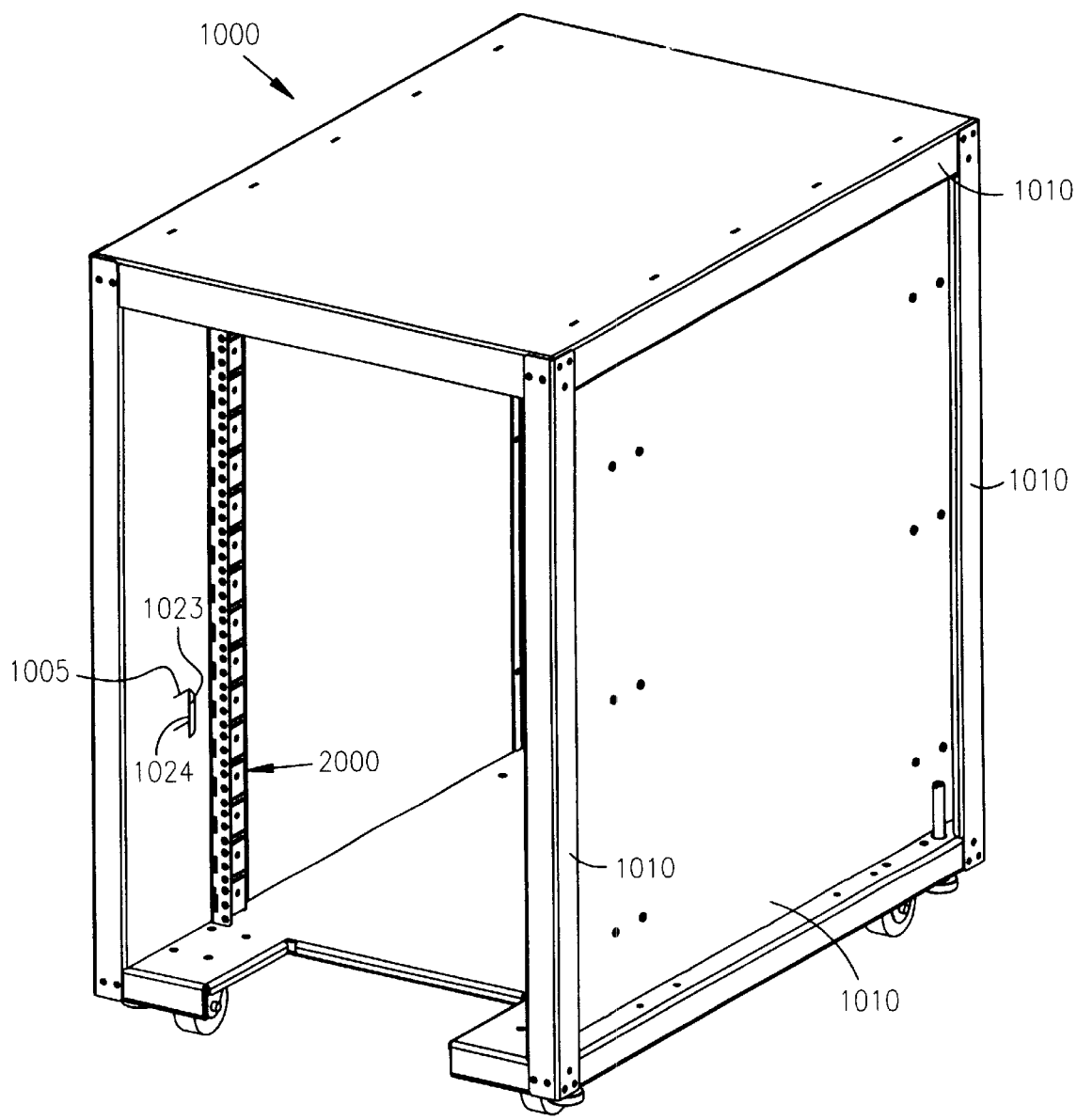
FIG. 1a is a rear view of one embodiment of an improved rack.
Figure 1B:
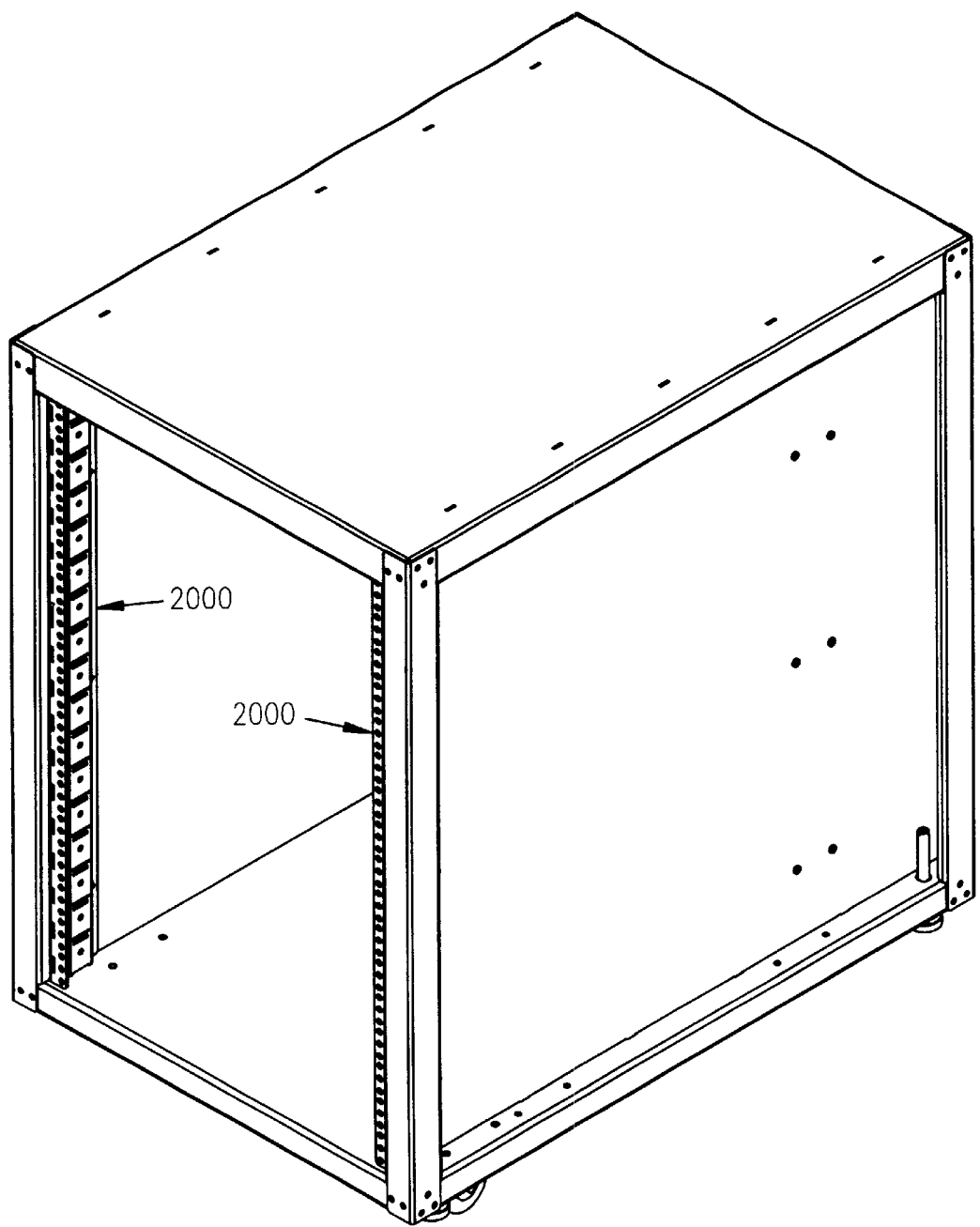
FIG. 1b is a front view of one embodiment of an improved rack.
Figure 1C:
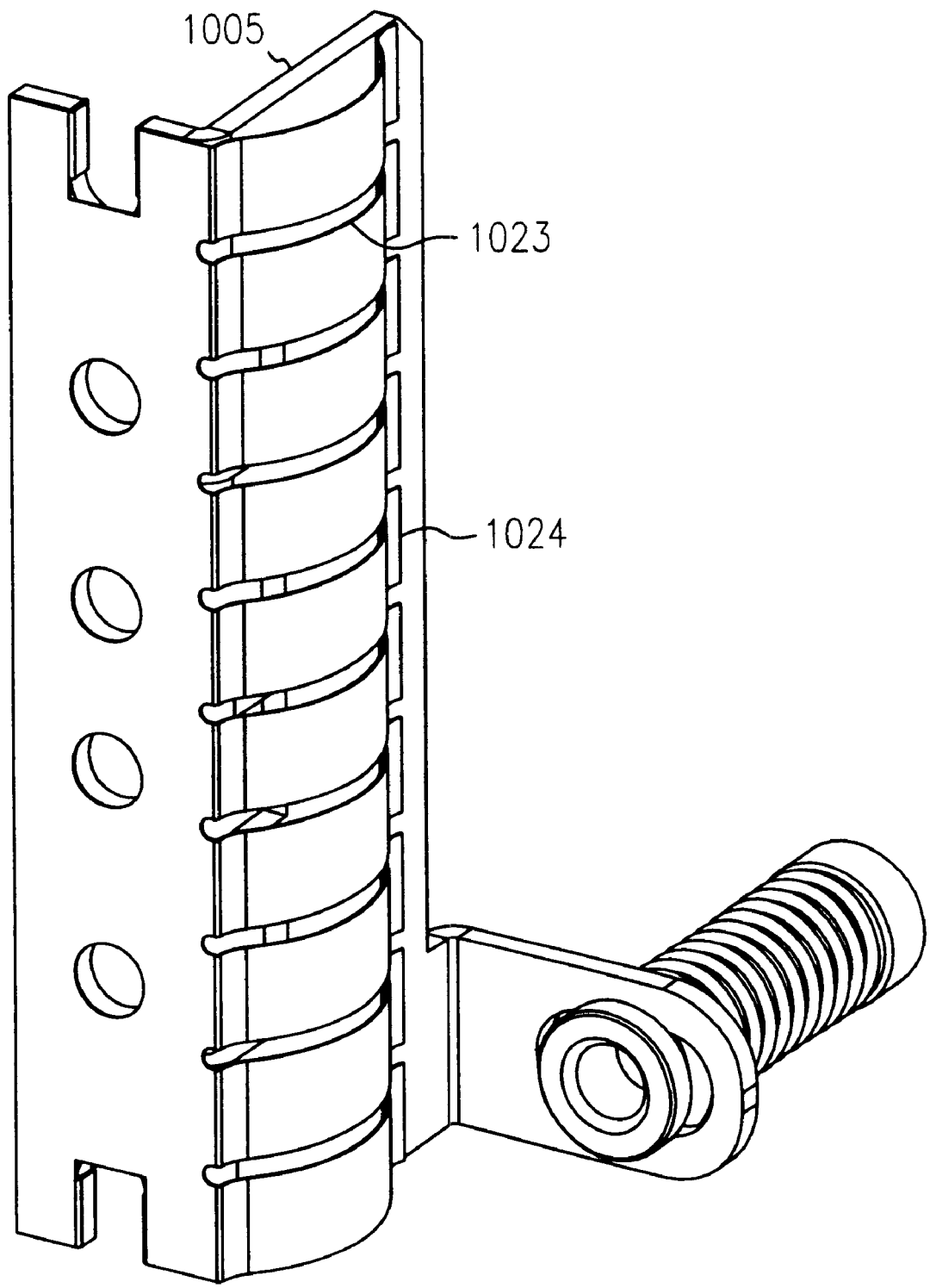
FIG. 1c is a view of a conductive feature according to one embodiment.
Figure 1D:
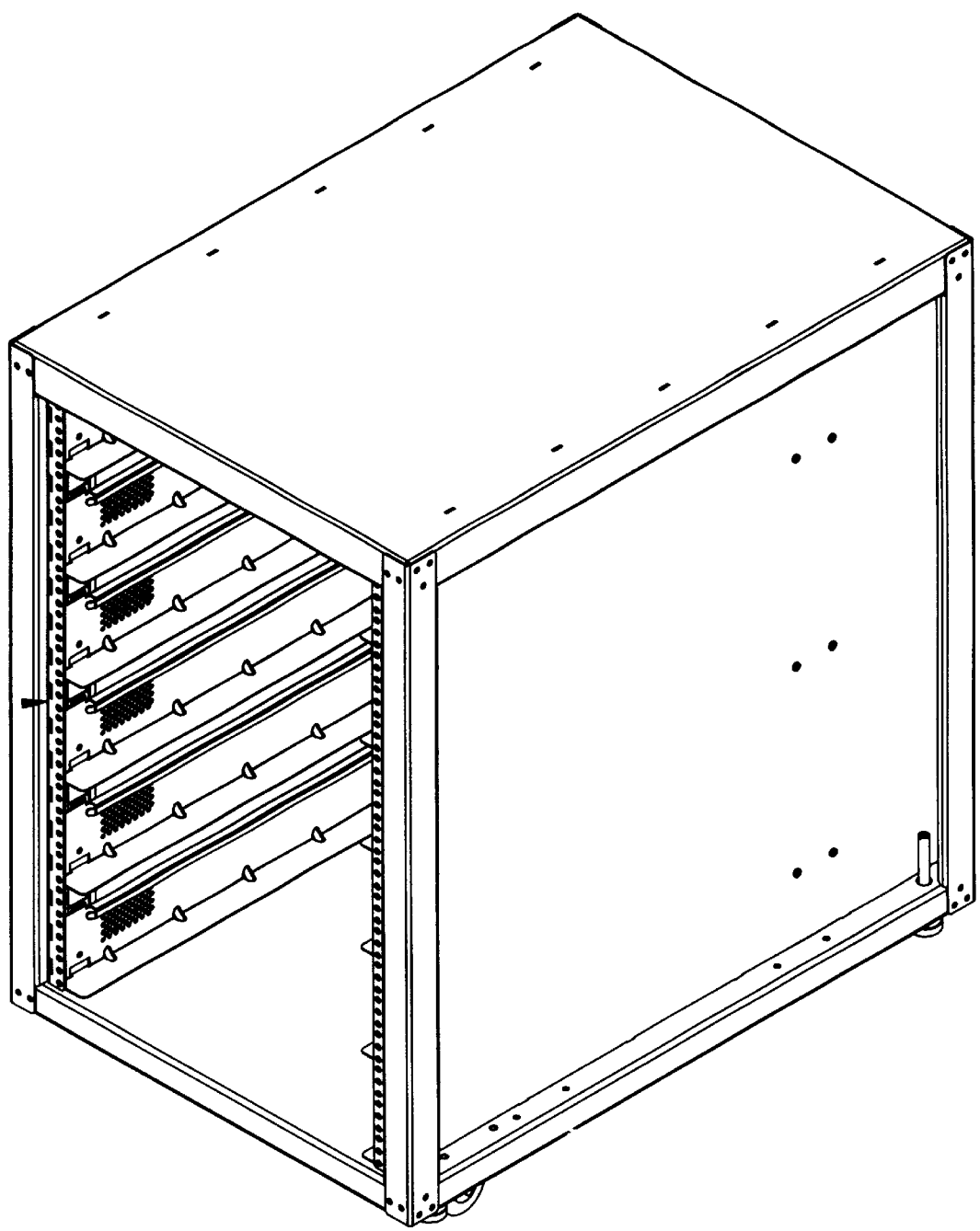
FIG. 1d is a view of one embodiment of a rack.

FIGS. 1a and 1b illustrate an embodiment of an improved computer rack 1000 for increasing the ease with which commercial computer systems are installed, serviced, upgraded and scaled. In one embodiment, the improved rack 1000 includes a first conductive feature 1005 for electrically coupling a computer module supported within the rack 1000 so that the first conductive feature 1005 provides a path to ground from the computer module to the rack 1000. An advantage of such a rack 1000 is the ability to eliminate grounding of computer modules external to the rack 1000 and provides for the grounding of a computer system in the absence of a sub-floor ground grid. Another advantage is an improved, more direct path from the computer module to ground. The rack 1000 can be used to provide a computer system having substantially all cable connections above the surface that the racks 1000 rest on. In one embodiment, a cable is connected to the computer module and the first conductive feature 1005 is located proximal to the cable connection. This too provides an improved path to ground. In another embodiment, the position of the computer module within the rack 1000 is adjustable and the first conductive feature 1005 provides a direct path to ground for all adjustable positions of the computer module. In one embodiment, the rack 1000 has a structure with a conductive portion and the first conductive feature 1005 is integral with the conductive portion of the rack 1000. In one embodiment, the first conductive feature 1005 is an arcuate shaped 1023 portion of the rack 1000 extending from the structure of the rack 1000 to contact a computer module. In one embodiment, the first conductive feature 1005 maintains a spring force against the computer module for maintaining an area of contact with the computer module. In one embodiment, the first conductive feature 1005 is an arcuate shaped 1023 projection along the vertical length of the rack 1000. In one embodiment, the first conductive feature 1005 also secures placement of the computer module within the rack 1000. In one embodiment, substantially all cables connected to computer modules within the rack 1000 are above the floor that the rack 1000 rests on. Ground Mechanism In another embodiment, the first conductive feature 1005 for contacting a computer module and for providing a path to ground from the computer module to the rack 1000 is comprised of a separate ground device 1005 that is coupled to the rack 1000. This can provide a versatile solution to grounding of computer modules within a rack 1000. In one embodiment, the ground device 1005 is placed proximal a cable connection to a computer module. In one embodiment, the ground device 1005 is adjustable to all adjustable positions of a computer module within the rack 1000. In one embodiment, the ground device 1005 includes a cable or a substantially flat lead. In another embodiment, the ground device 1005 includes a bracket. In one embodiment, the bracket includes at least one aperture for aligning with an industry standard aperture included on the rack 1000 for use in coupling the bracket to the rack 1000. In one embodiment, the bracket includes an arcuate shape portion 1023 extending from the bracket. In one embodiment, the arcuate shape portion 1023 provides surface contact with a smooth surface that is not damaging to the surface of the computer module. The arcuate shape portion 1023 includes a free end 1024 so that it deflects sufficiently upon contact with a computer module such that it maintains a spring force against a computer component. In another embodiment, the bracket includes a fastener for engaging a portion of the computer module for securing the placement of the computer module within the rack 1000. The arcuate shape portion 1023 for making direct contact with the computer module. In another embodiment the arcuate shape portion 1023 is for maintaining a spring force for maintaining an area of contact with the computer module. In another embodiment, the arcuate shape portion 1023 is comprised of separate tongs having an arcuate shape 1023. In one embodiment, the bracket includes a bracket fastener 1025 for engaging a portion of the computer module. In one embodiment, the bracket includes an aperture for aligning with an industry standard aperture. In one embodiment, the bracket includes a threaded aperture for aligning with an aperture on the rack 1000.

In another embodiment, the bracket includes a rotatable fastener for engaging the module. The fastener is contained within an aperture portion of a tab extending from the bracket. The fastener includes a cylinder with a center portion for receiving a threaded fastener and a stop internal to the cylinder for preventing the fastener from disengaging in the direction away from the direction of installation. The cylinder extends through the aperture on the tab and includes a portion acting as a stop to prevent the cylinder from disengaging from the tab. A spring exerting a spring force between the head of the fastener and the tab also serves to maintain the position of the fastener. This provides a reliable one piece unit for use in aligning, grounding and securing a module to a rack.

In another embodiment of the ground device, the ground device includes a guide portion for leading the module toward the portion of the ground device having arcuate shaped tongs. This improves the installability of the module into the rack and into contact with the ground device.

Figure 2A:
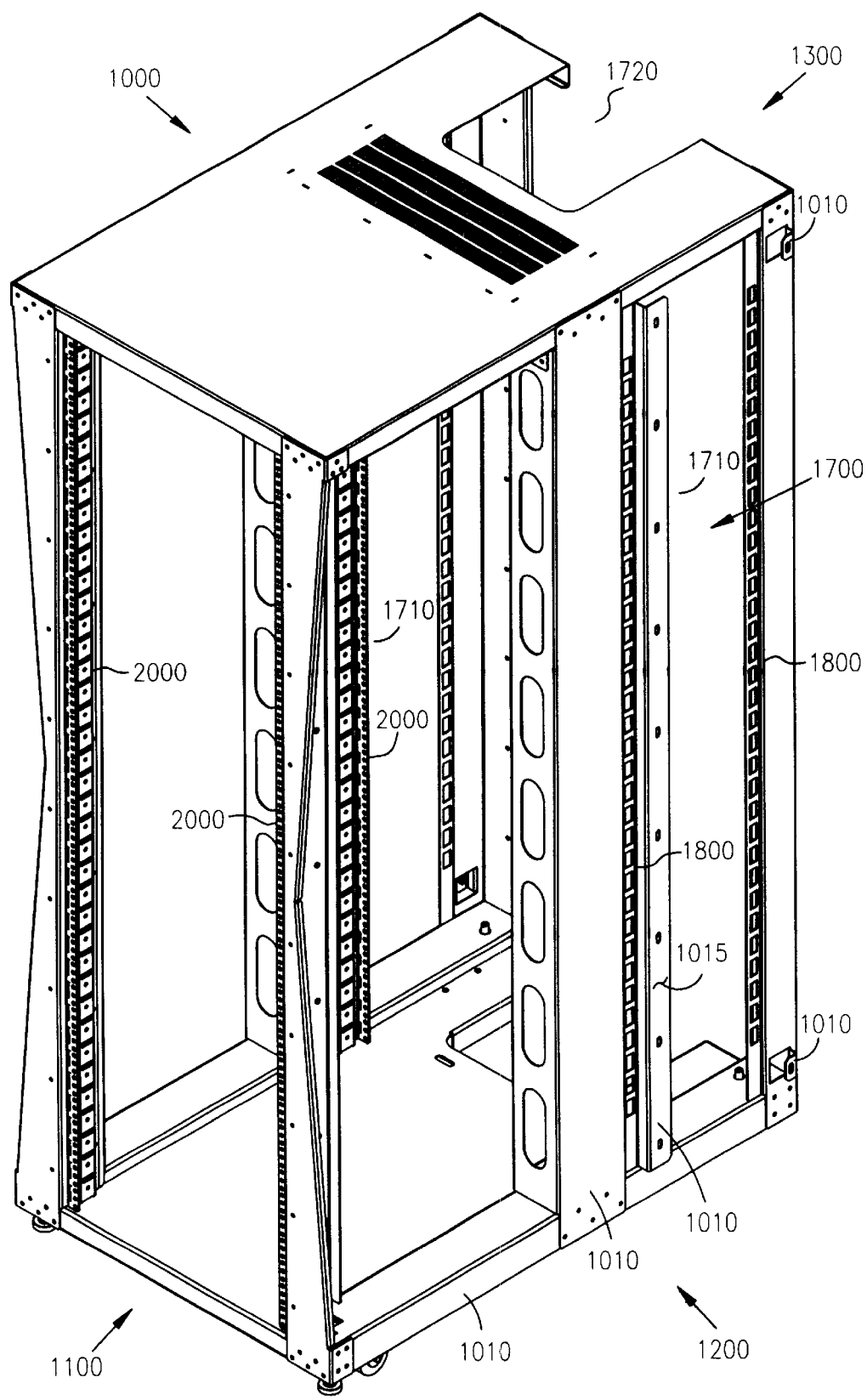
FIG. 2a is a front view of one embodiment of an improved rack.
Figure 2B:
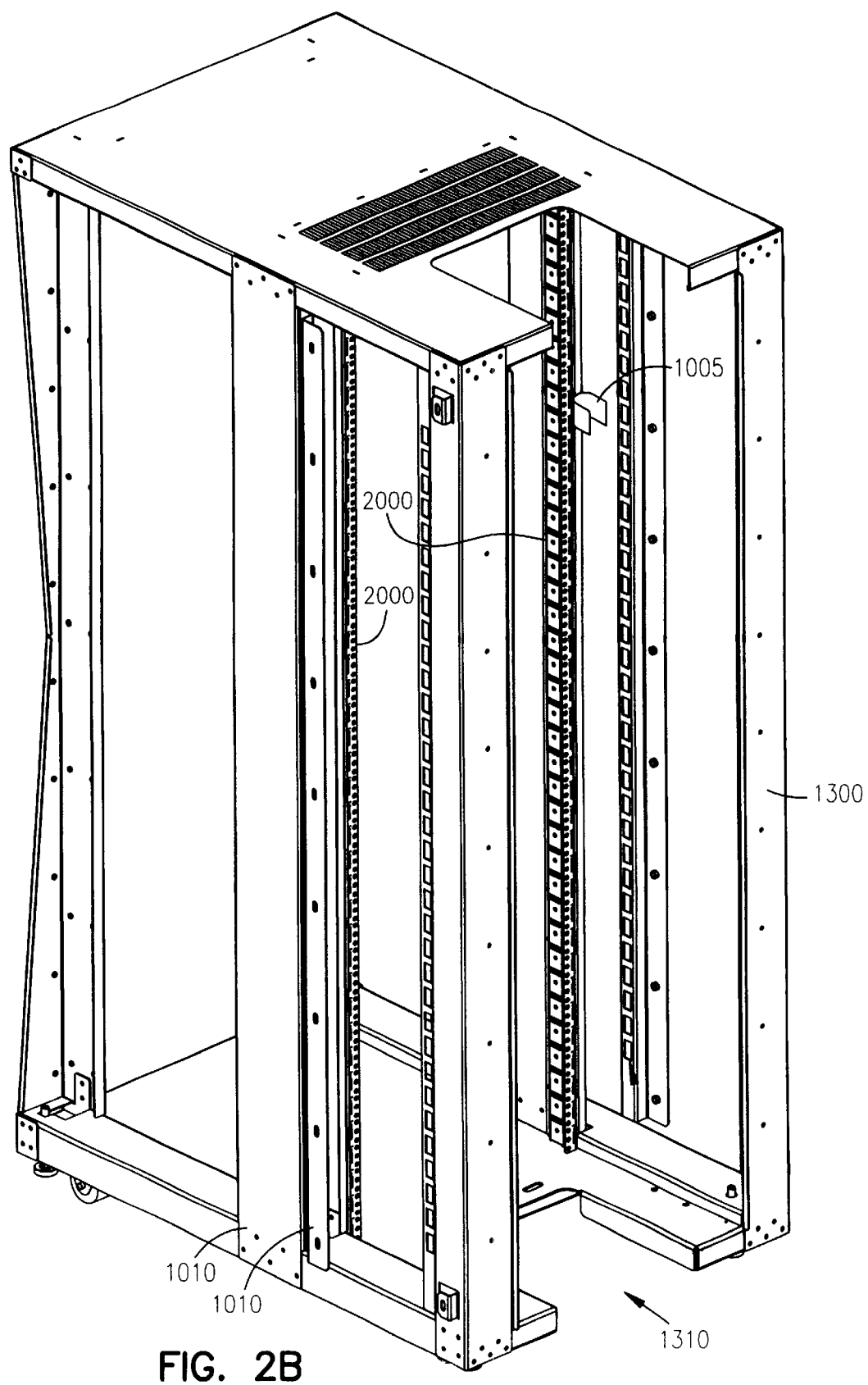
FIG. 2b is a rear view of one embodiment of an improved rack.
Figure 2C:
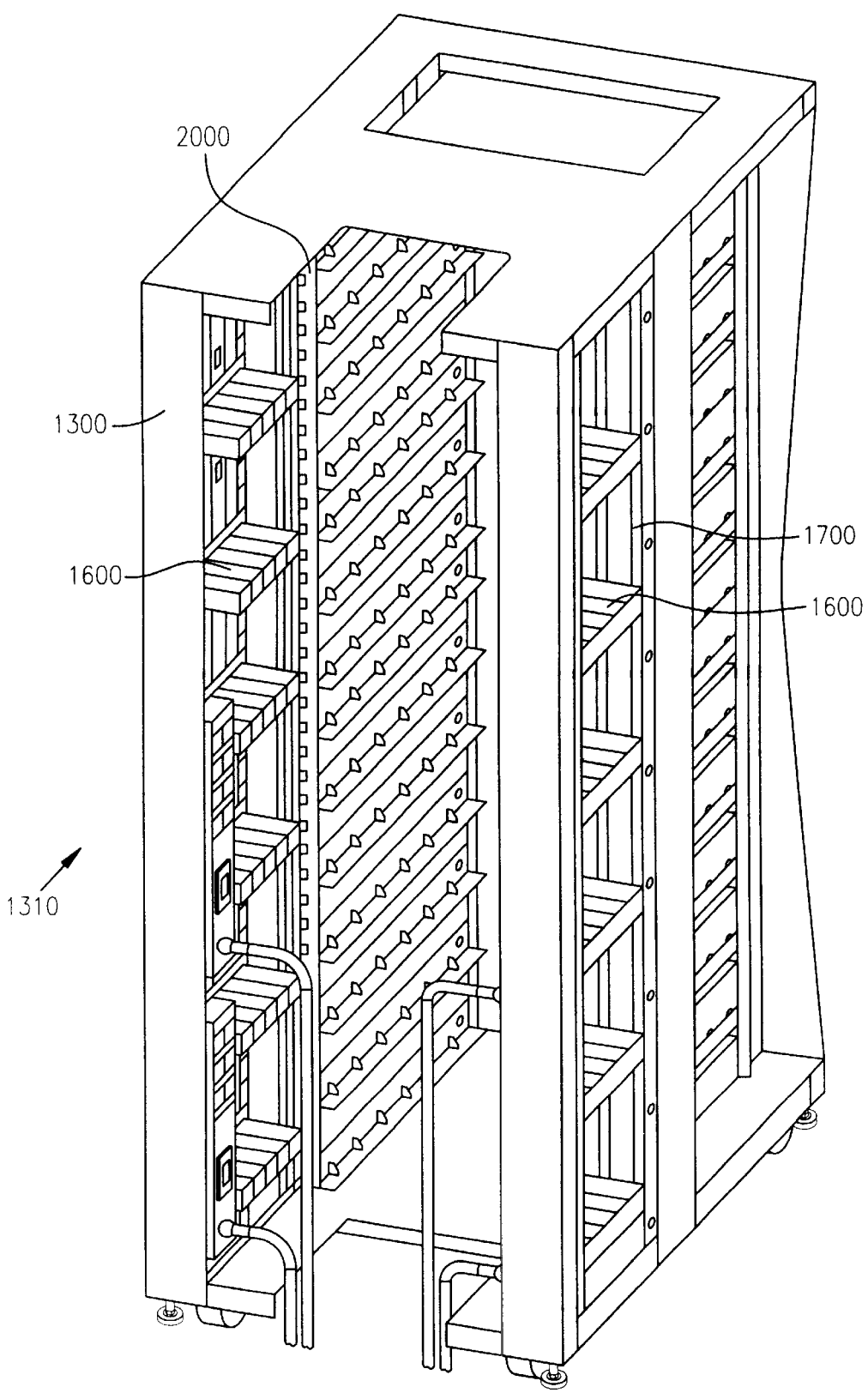
FIG. 2c is a rear view of one embodiment of an improved rack.
Figure 2D:
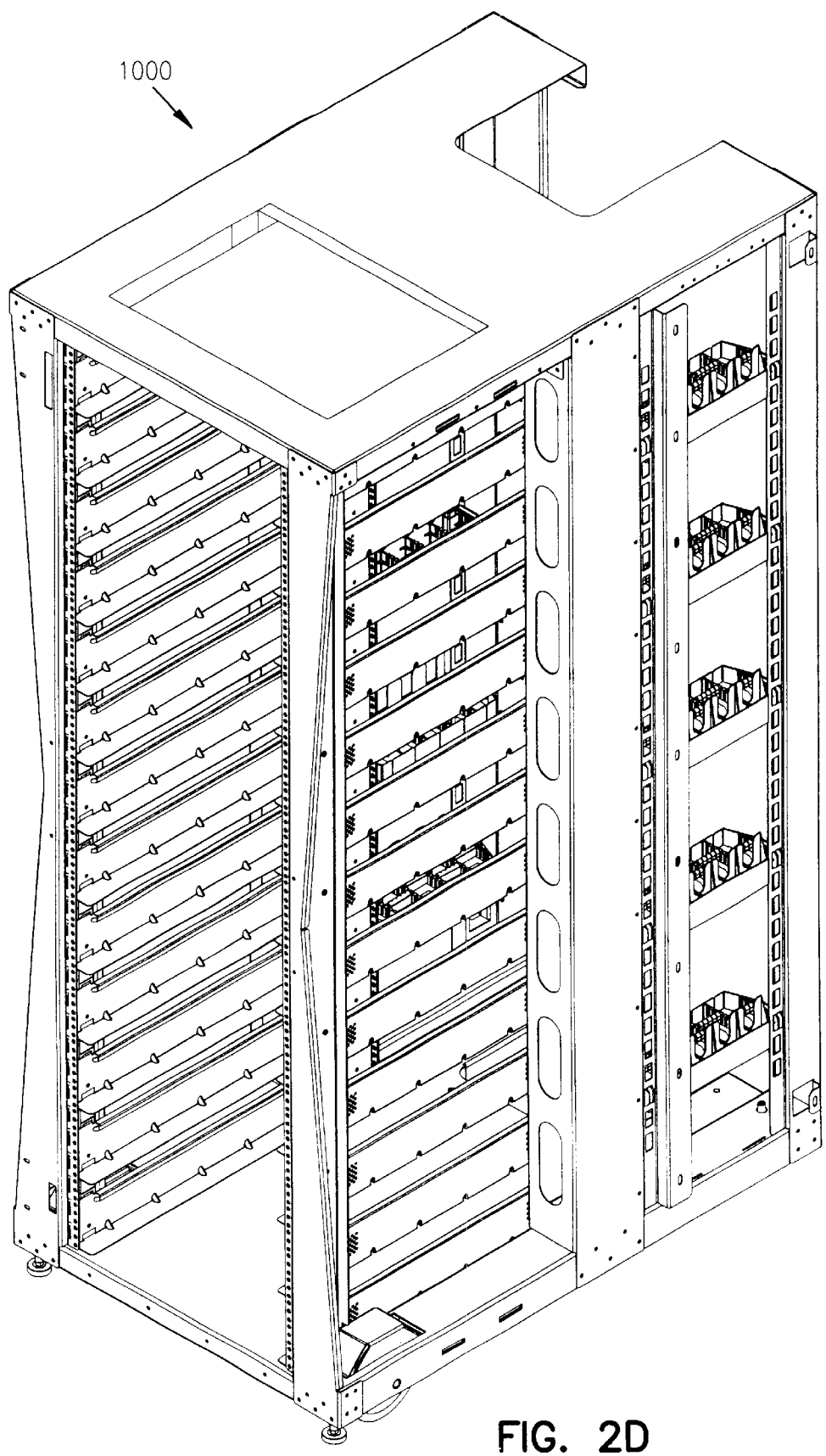
FIG. 2d is a front view of one embodiment of an improved rack.

FIGS. 2a and 2b also illustrate an improved rack 1000 including a second conductive feature 1010 for electrically coupling the rack 1000 to at least one adjacent rack 1000. The advantage of such a design is to create a system of electrically connected racks 1000 that act as ground to a computer system supported within the racks 1000. As in the previous set of embodiments an advantage of such a rack 1000 is the ability to eliminate grounding of computer modules external to the rack 1000 and provides for the grounding of a computer system in the absence of a sub-floor ground grid. Another advantage is an improved, more direct path from the computer module to ground. The rack 1000 can be used to provide a computer system having all cable connections above the surface that the racks 1000 rest on. This is also true in the case of larger computer systems having computer modules supported within a plurality of racks 1000.

In one embodiment, the second conductive portion 1010 of the structure includes a conductive surface feature 1015 for electrically coupling the rack 1000 to an adjacent rack 1000. In one embodiment the conductive surface feature 1015 runs vertically along the length of the rack 1000. In another embodiment, the conductive surface feature 1015 can also be used to mechanically couple the rack 1000 to an adjacent rack 1000 in order to maintain surface contact between the conductive surfaces of the rack 1000s. In one embodiment, the conductive surface feature 1015 can be connected to an adjacent rack 1000 using fasteners. In another embodiment, the rack 1000 additionally includes a first series of apertures 2020 corresponding to an industry standard hole template 2025 for use in mounting computer modules within the rack 1000, the rack 1000 can be used for mounting standard computer modules or "bricks." Thus the rack 1000 can be used to build a computer system substantially comprised of standard computer modules that does not require a sub-floor ground grid or external grounding and that provides an improved path to ground for improved performance of the computer system.

FIGS. 2a and 2b illustrate another embodiment of an improved rack 1000 structure including a first conductive feature 1005 having at least one portion proximal to at least one computer module and in electrical contact with the computer module supported within the rack 1000, as well as, a second conductive feature 1010 having at least one portion in electrical contact with at least one other separate rack 1000.

In one embodiment, the first conductive feature 1005 of the structure is proximal the second conductive feature 1010. This provides a direct path to ground from the computer module to the electrically connected racks 1000. In one embodiment, the second conductive portion 1010 is in electrical contact with an adjacent rack 1000.

In another embodiment, the second conductive feature 1010 is in electrical contact with a non-adjacent rack 1000. Grounding between racks 1000 is accomplished with a ground connector mounted between the racks 1000. In one embodiment, the ground connector is an upper ground support also for carrying a cable connected between modules in each rack. In an additional embodiment, the upper ground support is arced to provide increased service space between the racks 1000.

In another embodiment, the electrically connected racks 1000 each have a cable connection between a computer module supported within each rack 1000, for each rack the first conductive feature 1005 of the structure is proximal the cable connection. Again this provides an improved path to ground directly from the computer module to the electrically connected rack 1000s.

In one embodiment, the a rack 1000 includes a first surface feature 1015 portion in electrical contact with a first separate rack 1000, and a second surface feature 1015 in electrical contact with a second separate rack 1000.

Front & Rear Portion of Rack

FIGS. 1a, 1b, 2a and 2b illustrate an improved rack 1000 for a scalable computer system having a portion for supporting at least one computer module within the rack 1110 and a portion dedicated to cable management 1310.

In one embodiment, the portion for supporting the computer modules 1110 is the front portion 1100 of the rack 1000. In one embodiment, the rack 1000 includes a module with a module release mechanism for releasing a portion of the module without requiring that the entire module be removed. This permits hot-swapping of components within the module. One such module release mechanism is described in 00499.029US1.

In one embodiment, the cable management portion 1310 is the rear portion 1300 of the rack 1000. This provides a rack 1000 with improved cable management over existing racks 1000. In another embodiment, the inner dimension of the rear portion 1300 of the rack 1000 is wider than the inner dimension of the front portion 1100 of the rack 1000 for providing additional space for organizing the cables.

In one embodiment, the rack 1000 includes a cable organizer 1600 in the rear of the rack 1000 for positioning cables away from computer modules to provide clear access to the computer modules. An additional benefit to managing cables in this manner is improved access to the rear of the computer module. This is advantageous as improvement to the module design has made certain portions of the module removeable without removing the entire module. A hot swappable PCI card such as is described in 00499.030US1 is one such example.

In another embodiment, the rack 1000 includes a cable organizer 1600 proximal a passage 1700 in the rack 1000 to organize cables routed through the passage 1700.

In another embodiment, the rack includes a vent on the top surface for allowing additional airflow through the rack.

Passages

FIGS. 2a and 2b illustrate an improved rack 1000 including passages 1700 for allowing a cable to pass through the rack 1000. In one embodiment, the rack 1000 at least one side passage 1710 is included on at least one side portion 1200 of the rack 1000. In another embodiment, the rack 1000 includes a top passage 1720 through the top portion 1500 of the rack 1000. In another embodiment, the rack 1000 includes a front portion 1100 and a rear portion 1300, a passage 1730 being included in the top rear portion 1300 of the rack 1000. In one embodiment, the racks 1000 are placed back-to-back so that the rear portion 1300 of each rack is adjacent the rear portion 1300 of the other rack with a side passage 1710 included in the side portion 1200 of each rack 1000 so that cables can be accessed through the side passage 1710. In another embodiment, the rack 1000 includes a cable organizer 1600 proximal the passage 1700 for positioning cables routed through the passage. In another embodiment, passages improve the airflow through the rack.

Cable Organizer

FIG. 2a and 2b illustrate an improved rack 1000 including a cable organizer 1600 for maintaining placement of cables relative to computer modules within the rack 1000. In one embodiment, the rack 1000 includes cable organizer mounting apertures 1800 that can be used to couple the cable organizer 1600 to the rack 1000. In one embodiment, the rack 1000 includes a series of organizer mounting apertures 1800 running vertically along the length of the rack 1000 for receiving the cable organizer. The cable organizer 1600 can be snapped into the desired position along the series of apertures. In another embodiment, the rack 1000 includes a cable organizer 1600 that can be adjusted to various positions in the rack 1000. This is especially advantageous where the computer modules have adjustable positions within the rack 1000, as the cable organizer 1600 can be repositioned within the rack 1000 to locations where cable management is needed. In one embodiment, the cable organizer includes arms for installing into the cable organizer apertures 1800. The arms deflect toward one another upon installation, then spring to provide an interference fit against the edge of the apertures 1800. In one embodiment, the cable organizer includes a front portion for receiving the cable, the front portion having arms deflecting into the cavity to create a passage for the cable to enter, then returning to their orginal position once the cable is placed within the cavity. In another embodiment the cable organizer includes a divider for providing adjustable compartment sizes and for separating cables.

Furthermore, use of a cable organizer 1600 for cable management is especially advantageous where cable density is increased. As computer systems are scaled to larger systems, cable density increases and the need for cable management increases. In one embodiment, the cable organizer 1600 includes compartments for storing multiple cables. In another embodiment, the cable organizer 1600 supports a portion of the weight of the cable or cables positioned inside. This is advantageous in that the weight of cables used in the industry has increased and may continue to increase. Providing support to the cables can reduce the bending forces imparted on the components at the connection to the cable and can help to maintain the integrity of the connection.

In one embodiment, the rack 1000 includes a cable organizer 1600 for positioning cables away from computer modules so that computer modules or removable portions of computer modules can be more easily and quickly accessed. In another embodiment, the rack 1000 includes a cable organizer 1600 placed proximal a passage 1700 in a rack 1000, as described above, to maintain placement of cables routed through the passage.

In one embodiment, the rack 1000 includes a front portion 1100 and a rear portion 1300 having space for housing cables connected to modules within the rack 1000 and including a cable organizer 1600 having a flexible portion with a Velcro type closure for retaining the cable. In another embodiment, the has a C-shaped cross section defining a circular cavity for receiving the cable. The organizer can include flanges for contacting the cable upon installation into the organizer, the force of the cable on the flanges causing the C-shaped cross section to snap open and then close once the cable is inside the cavity. In yet another embodiment, the cable organizer 1600 can have a cavity for receiving the cable defined by a set of arms extending straight out from the rear of the organizer then crossing one in front of the other with space between the arms for inserting the cable, the cable is then manually guided to the cavity behind the arms. In one embodiment, the cable organizer 1600 extends downward to control the position of the cable along a portion of the length of the cable.

Service Shelf

Figure 3:
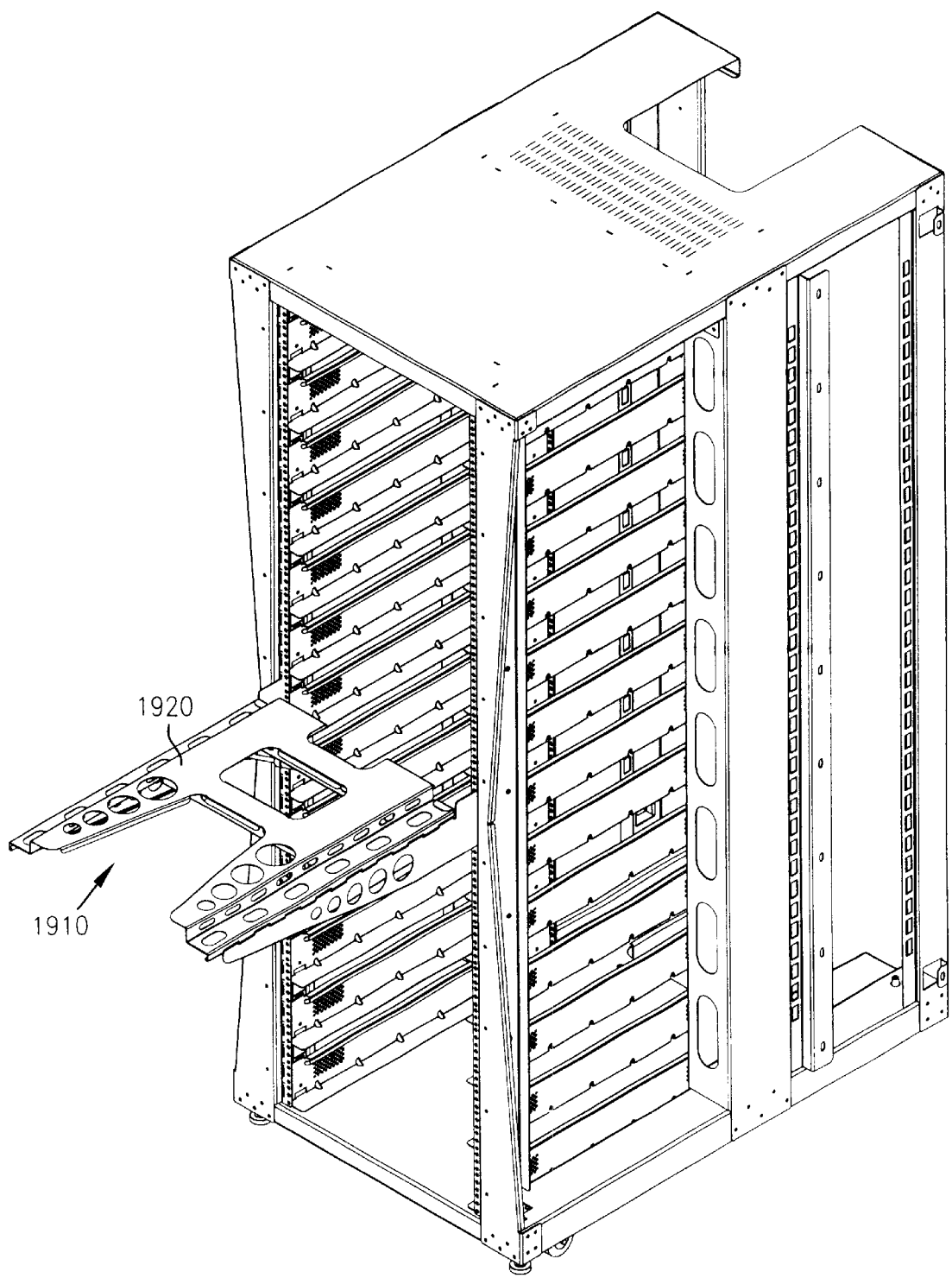
FIG. 3 is a front view of an embodiment of an improved rack including an exterior platform.

FIG. 3 illustrates an improved rack having an external platform 1900. In one embodiment, the external platform 1900 is an installation and service platform 1910 for use in installing and servicing computer modules or portions of computer modules.

In one embodiment, the platform 1900 aligns with the intended position of the module so that the module can be easily installed. In module can be removed in a like manner. In another embodiment, the platform 1900 is vertically adjustable along the length of a series of apertures 2030 running vertically on the rail 2000 positioned on each side of the front portion 1100 of the rack 1000. In another embodiment, the tabs on the platform 1900 provide precise alignment with the module position. In one embodiment, a platform mounting system having precisely machined and located alignment tabs for installing and securing into precisely machine and located apertures 2030 such as vertical slots 2035, provide optimal alignment of the platform horizontally and vertically relative to the rack 1000 and relative to the module position within the rack 1000. In one embodiment, the The platform 1900 can be placed in front of the computer module requiring service and the computer module released from the rack 1000 and slid into position on the service platform 1910 .

Figure 4:
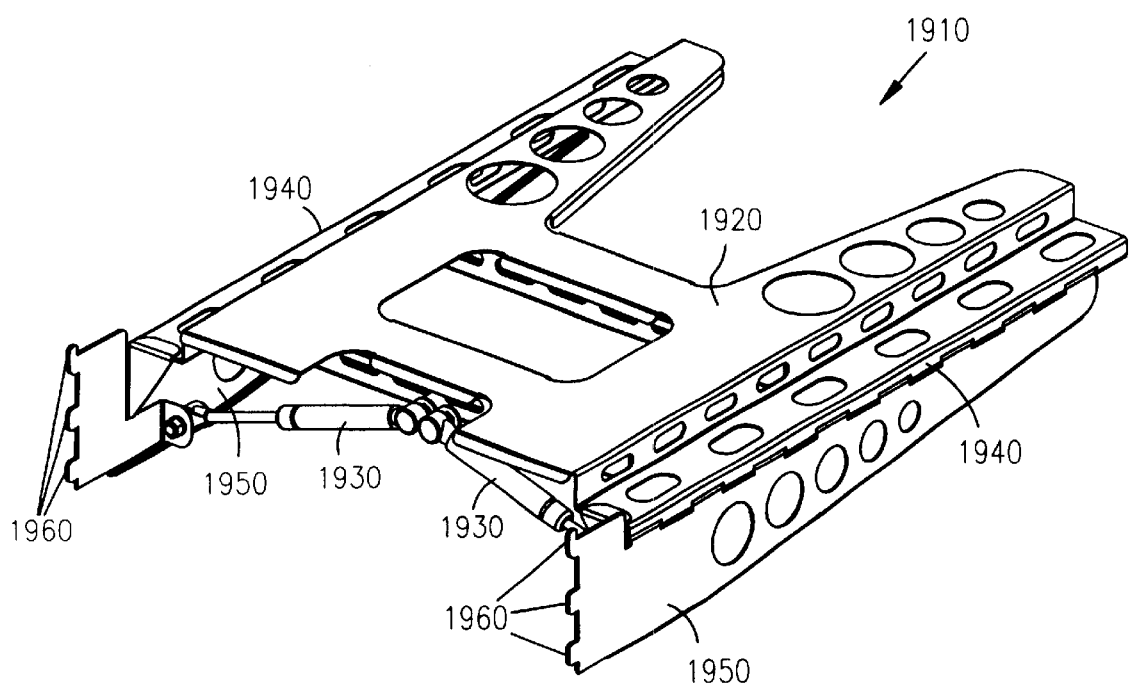
FIG. 4 is a rear view of an embodiment of an exterior support.

In yet another embodiment, the service platform 1910 includes features for improving the ease of service such as a raised work area 1920 where components can be clamped into place. In another embodiment, the service platform 1910 includes a work surface capable of withstanding heat in the ranges typical of service operations. In another embodiment, the raised work area 1920 is electrically insulated from the portion of the service platform 1910 connecting to the rack 1000. In another embodiment shown in FIG. 4, the service platform 1910 includes a set of shock absorbers 1930 for absorbing shock and maintaining the position of the sides of the platform relative to the upper portion of the service platform 1910. In one embodiment, the side arms 1950 of the platform are hinged 1940 and the shocks can be disengaged from the side arms 1950 so that the side arms 1950 can be folded down, placing the platform in a substantially flat or stowable configuration. In another embodiment, the rack 1000 includes an area for stowing 1555 the platform 1900. In one embodiment, the stowage area 1555 is comprised of a set of storage supports 1553 extending from the underside of the rack 1000 such that the platform 1900 can be slid in and out of the stowage area 1555.

Rail

FIG. 1*a*, 1*b*, 2*a*, and 2*b* illustrate an improved rack 1000 with an improved rail 2000. In one embodiment, the rack 1000 includes at least four vertical rails 2000 having a first rail portion 2010 with a first series of apertures 2020 and a second series of apertures 2030 for use in connecting supports to the rack 1000. In one embodiment, the first series of apertures 2020 is for use in connecting an internal support. In one embodiment, the first series of apertures 2020 comply with an industry standard size hole template 2025, The rack 1000 also includes a unique second series of apertures 2030 adjacent the first series of standard apertures 2025. The second series of apertures 2030 can be used to mount additional features to the rack 1000 without interfering with the use of the first series of standard apertures 2025. In one embodiment, the second series of apertures 2030 can be used to mount an external platform 1900 such as the service platform 1910 described above. In one embodiment, the second series of apertures 2030 includes vertically shaped slots 2035 for receiving tabs extending from each side arm 1950 of the service platform 1910. The tab and slot configuration of this embodiment allow the external platform 1900 to be adjusted to various positions along the length of the rack 1000 without interfering with the use of the first series of apertures 2020 on the vertical rail 2000. In one embodiment, the rail 2000 includes apertures precisely machined and located in order to provide precision alignment to components mounted off of the apertures.

Internal Support Shelf

Figure 5A:
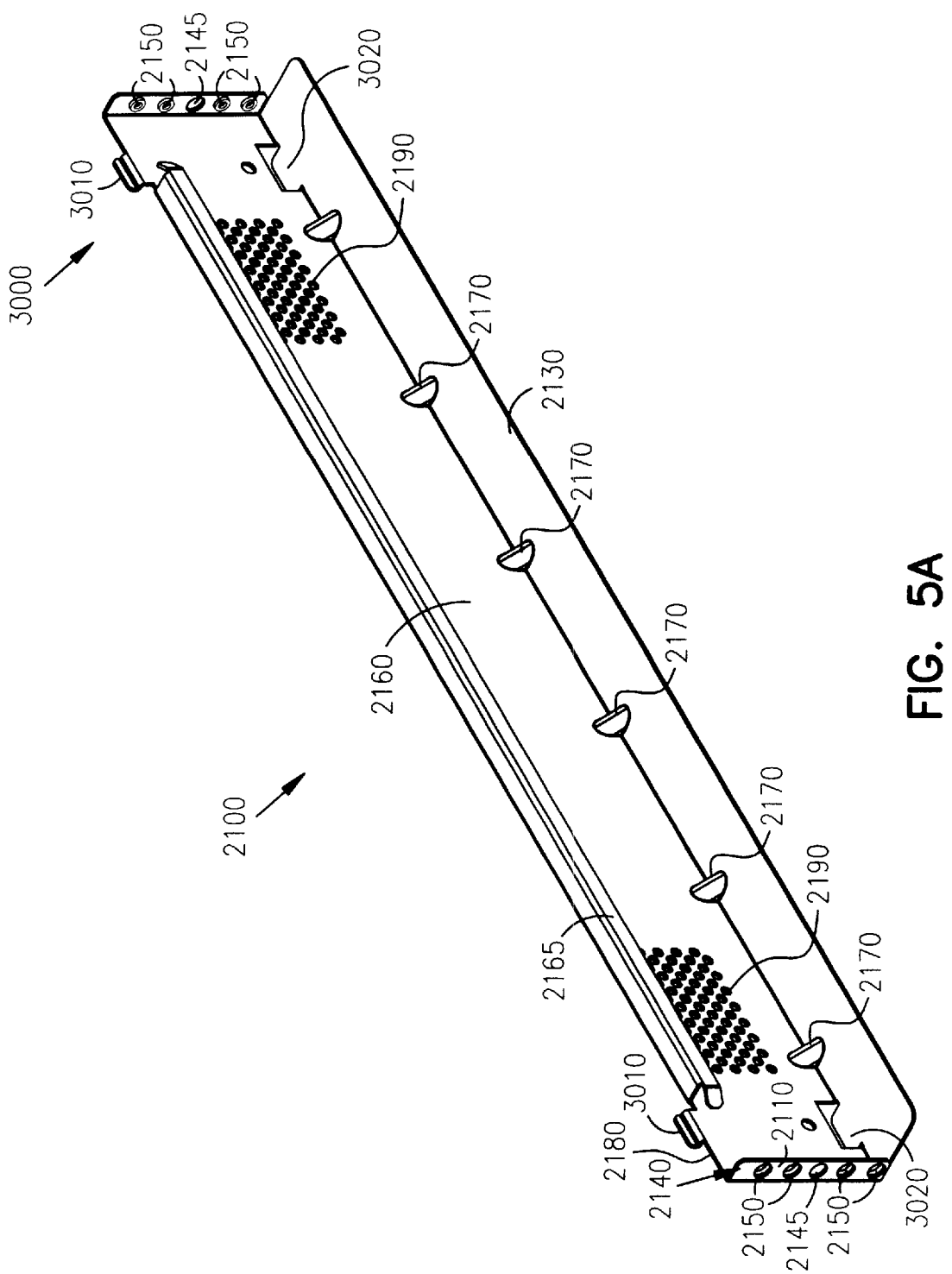
FIG. 5a is a view of an embodiment of an interior support.
Figure 5B:
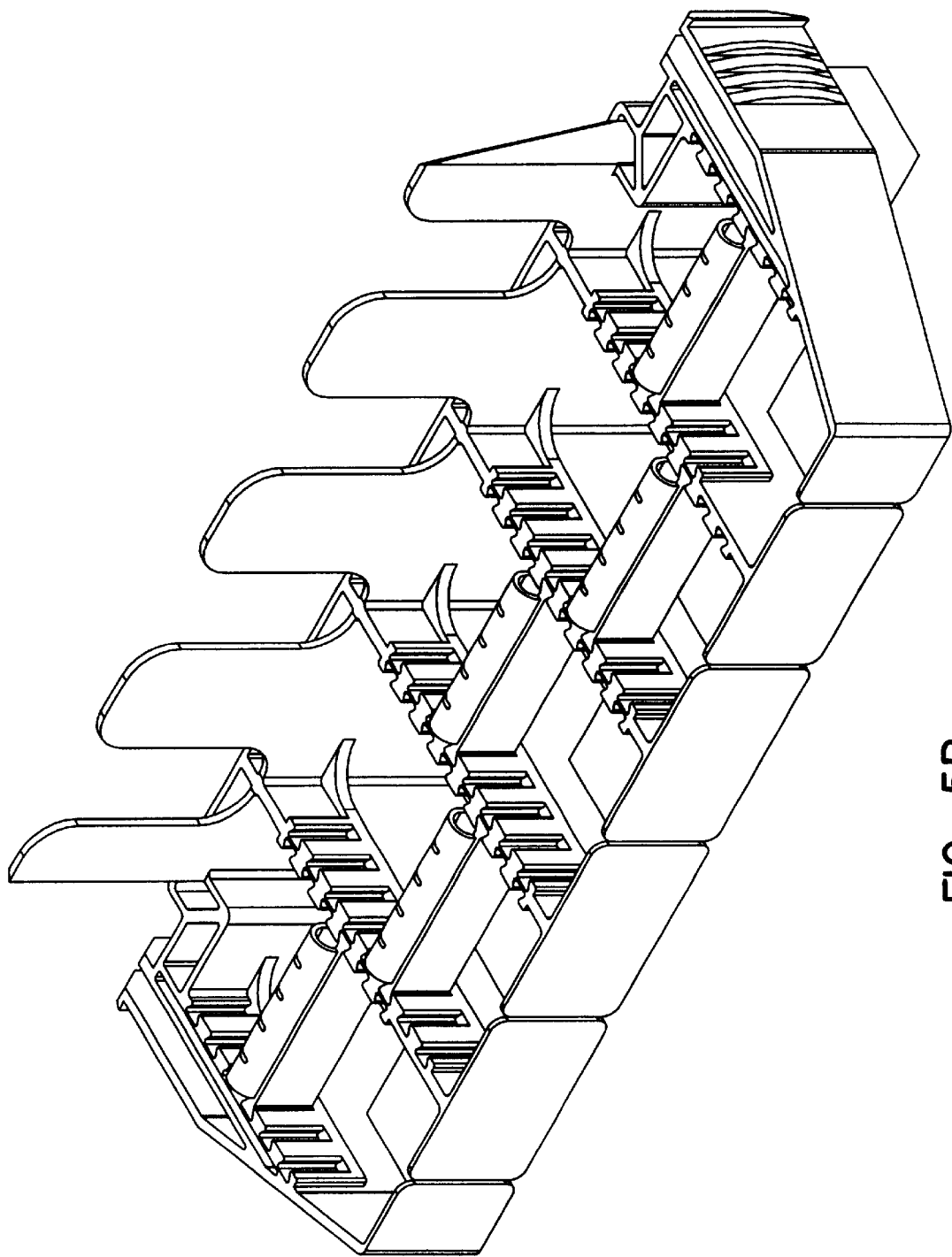
FIG. 5b is a view of a cable organizer according to one embodiment.

FIG. 2*a*, 2*b*, and 5 illustrate an improved internal support 2100 for use in mounting computer modules in an improved rack 1000. The improved support 2100 provides improved adjustability in that the support 2100 can be vertically adjusted along the length of the rack 1000 with greater ease than conventional supports. In one embodiment, the support 2100 includes a front mounting portion 2110 and rear mounting portion 2120 including a series of holes 2140 and a support portion 2130 being coupled between the front 2110 and rear 2120 mounting portion.

In one embodiment, the series of holes 2140 include threaded holes 2150 for aligning with a first series of apertures 2020 on a vertical rail 2000 coupled to the rack 1000. A threaded fastener inserted through an unthreaded aperture on the rail 2000 can then engage the threaded aperture of the front 2110 and rear 2120 mounting portion of the support 2000 to secure the support. This is particularly advantageous when the first series of apertures on the vertical rail 2000 are of a series of apertures of standard industry size 2025 that is relatively small. The relatively small size of the apertures 2025 on the rail 2000 dictate use of relatively small fasteners which can be awkward to handle because of their size. It also eliminates the need for a two piece fastener that must be handled on both sides of the aperture 2025 on the vertical rail 2000 and allows use of a one piece fastener from only the outer face 2015 of the rail 2000 instead. In another embodiment, the front mounting portion 2110 of the support 2000 includes a portion that is extended when forming the threaded holes 2140 so that the threaded portion is actually wider than the thickness of the mounting portion 2110, 2120. This increases the thread engagement providing for improved fastener retention.

In an alternative embodiment, the mounting portion 2110, 2120 of the support includes both threaded and unthreaded apertures. This provides increased flexibility with regard to the type of fastener used to secure the support to the rack 1000. In one embodiment, an internal support mounting system includes a center hole that is precisely machined and located to tight tolerances for aligning with a precisely machined and located aperture on the rail 2000 having precisely machined and located rail apertures such as apertures 2020 and 2025. The result is highly consistent placement of modules within the rack 1000 system. In one embodiment, this enables precise and repeatable alignment with other features of the rack such as the external platform 1900 for all adjustable positions of the modules within the rack and for all adjustable positions of the platform.

In another embodiment, the internal support further includes a side portion 2160 coupled between the front mounting portion 2110 and rear mounting portion 2120 and coupled to the support portion 2130. In one embodiment, the side portion 2160 includes a guide portion 2165 extending from the side portion 2160 for positioning the computer component. The guide portion 2165 helps to guide the position of the module during installation into the rack and helps to maintain its horizontal placement within the rack. This helps to improve alignment required by additional features such as a release mechanism for releasing a portion of a module. In another embodiment, the front portion of the module includes flanges extending out each side. Each flange includes a pin portion for inserting into an aperture in the rail. In one embodiment, the pin and aperture are precisely machined and located to strict tolerances so that placement of the pin into the aperture controls the placement of the module in the rack. This also helps to improve alignment for additional features such as a release for releasing a portion of the module from the rack such as described in 00499.029US1.

In another embodiment, the interface between the side portion 2160 and the support portion 2130 includes embossments 2170 for strengthening the carrying capacity of the support 2000. This allows the support 2000 to be formed from a thinner material or a lower strength material than could be used otherwise.

In another embodiment, the internal support 2000 includes side mounting features 33000 that can be used in conjunction with the features 2140 on the front 2110 and rear mounting 2120 portions or can be used independently. In one embodiment, the side mounting features 3000 include tabs for engaging slots in a custom rail 2000. The side mounting features 3000 include a first set of mounting tabs 3010 extending from the top edge 2180 of the rack 1000 and a second set of mounting tabs 3020 extending outward from the support surface. The custom rail 2000 includes a series of side apertures running 2040 the length of the rack 1000. In one embodiment, the custom rail 2000 includes a first rail portion 2010 having a first series of apertures 2020 such as those described above and a side rail portion 2050 including the series of side apertures 2040. The series of side apertures 2040 are oriented such that when the mounting tabs 3010, 3020 engage the side apertures 2040 anywhere along the length of the rack 1000, the support 2000 is positioned so that the apertures on the front mounting portion 2110 and rear mounting portion 2120 align with the first series of apertures 2020 on the rack 1000. This also improves the ease of fastening the front mounting portion 2110 and rear mounting portion 2120 to the rail 2000. In another embodiment, the support includes airflow perforations 2190.

Precise placement of modules within the rack with the precision methods described allows for optimization of module dimensions. Modules can be designed to have maximum height, width, and depth in order to satisfy industry standards while providing the maximum amount of space internally to the module and also maximizing module content within racks 1000. Features providing for automatic alignment and placement of components such as between the rails, internal supports, external platform, modules, ground device, and rack to rack grounding features improves installation, serviceability and upgrade in an environment traditionally unfavorable to these needs. This provides for improved ability to provide larger computer systems and allows computer systems using these modules to be scaled, installed, serviced and upgraded at greatly improved levels of performance.

Router Placement

FIG. 6 illustrates use of the improved rack 1000 for supporting a scalable computer system within the rack 1000. The computer system of this embodiment is optimized by placing the Router brick centrally to minimize cable lengths. In one embodiment the rack 1000 is suitable for supporting computer modules having a proportionality described as 1 unit, 2 unit, 3 unit, 3.5 unit and 4 unit sizes. The 1 unit size simply being half the height of the 2 unit size and so on. The rack 1000 for supporting computer modules of this size has a 17 unit proportional height. In one embodiment the height of the rack 1000 is thirty-five inches and cable lengths are less than about 0.5 meter in length. In one embodiment, the depth of the rack 1000 is about 33 inches to provide for supporting the computer modules and supporting the cables within.

FIG. 7 illustrates use of the improved rack 1000 for supporting a scalable computer system within the rack 1000. The computer system of this embodiment is optimized by placement of the Router brick centrally to minimize cable lengths. In one embodiment the rack 1000 is suitable for supporting computer modules having a proportionality described as 1 unit, 2 unit, 3 unit, 3.5 unit and 4 unit sizes. The 1 unit size simply being half the height of the 2 unit size and so on. The rack 1000 for supporting computer modules of this size has a 39 unit proportional height. In one embodiment the height of the rack 1000 is seventy-four inches and cable lengths are less than about 1 meter in length. In various embodiments, the rack 1000 can include the additional features described.

Figure 8:
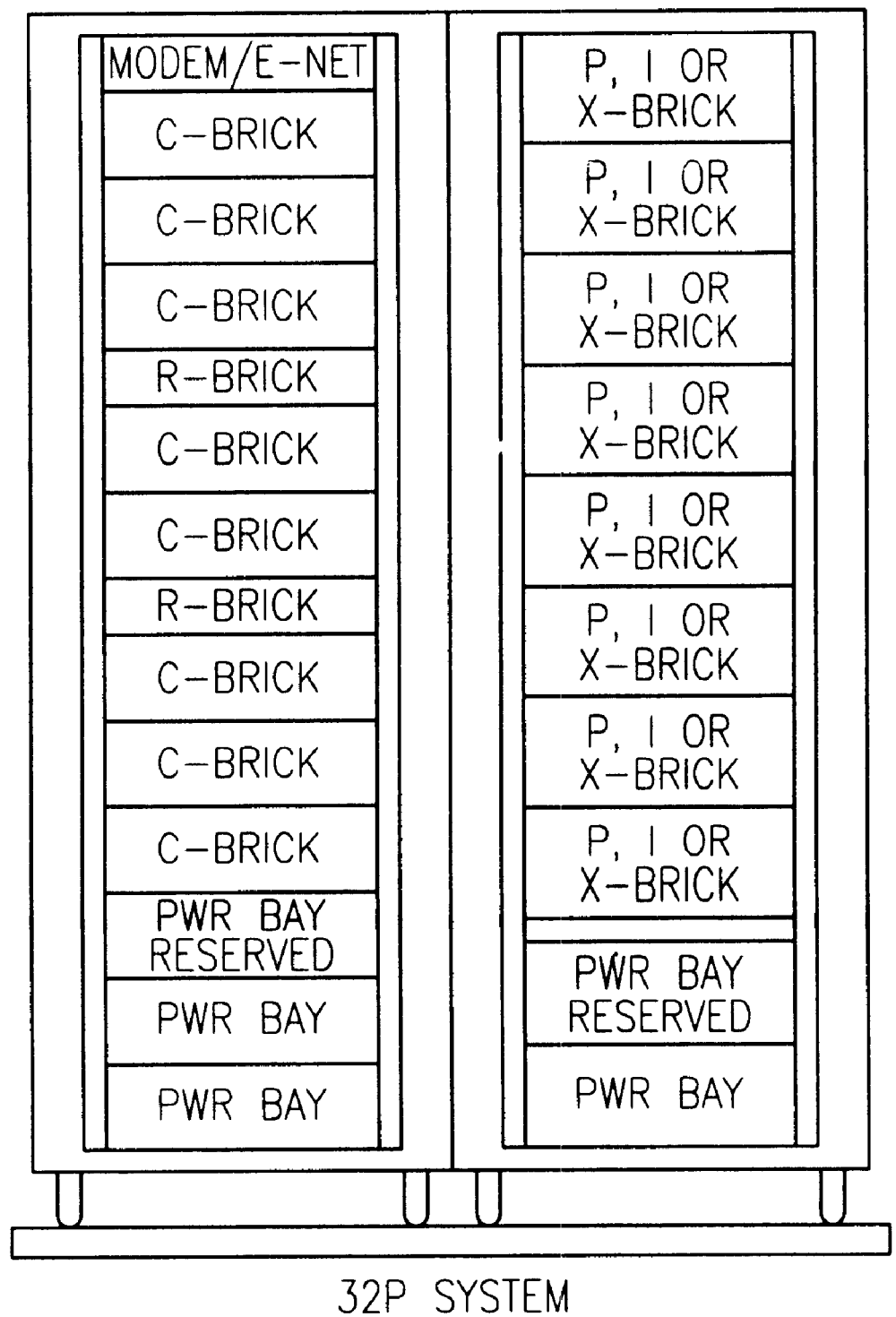
FIG. 8 is a view of an embodiment of an improved rack and scalable computer system.

FIG. 8 illustrates use of the improved rack 1000 for supporting a scalable computer system within a row of two racks 1000 for minimizing cable lengths. In one embodiment, the Router bricks are co-located in a single rack 1000 and centrally located within the rack 1000 in order to minimize cable distance between Routers and from Routers to CPU bricks. In one embodiment, the racks 1000 are electrically connected. In one embodiment, the racks 1000 are mechanically connected. In various embodiments, the rack 1000 can include the additional features described.

Figure 9:
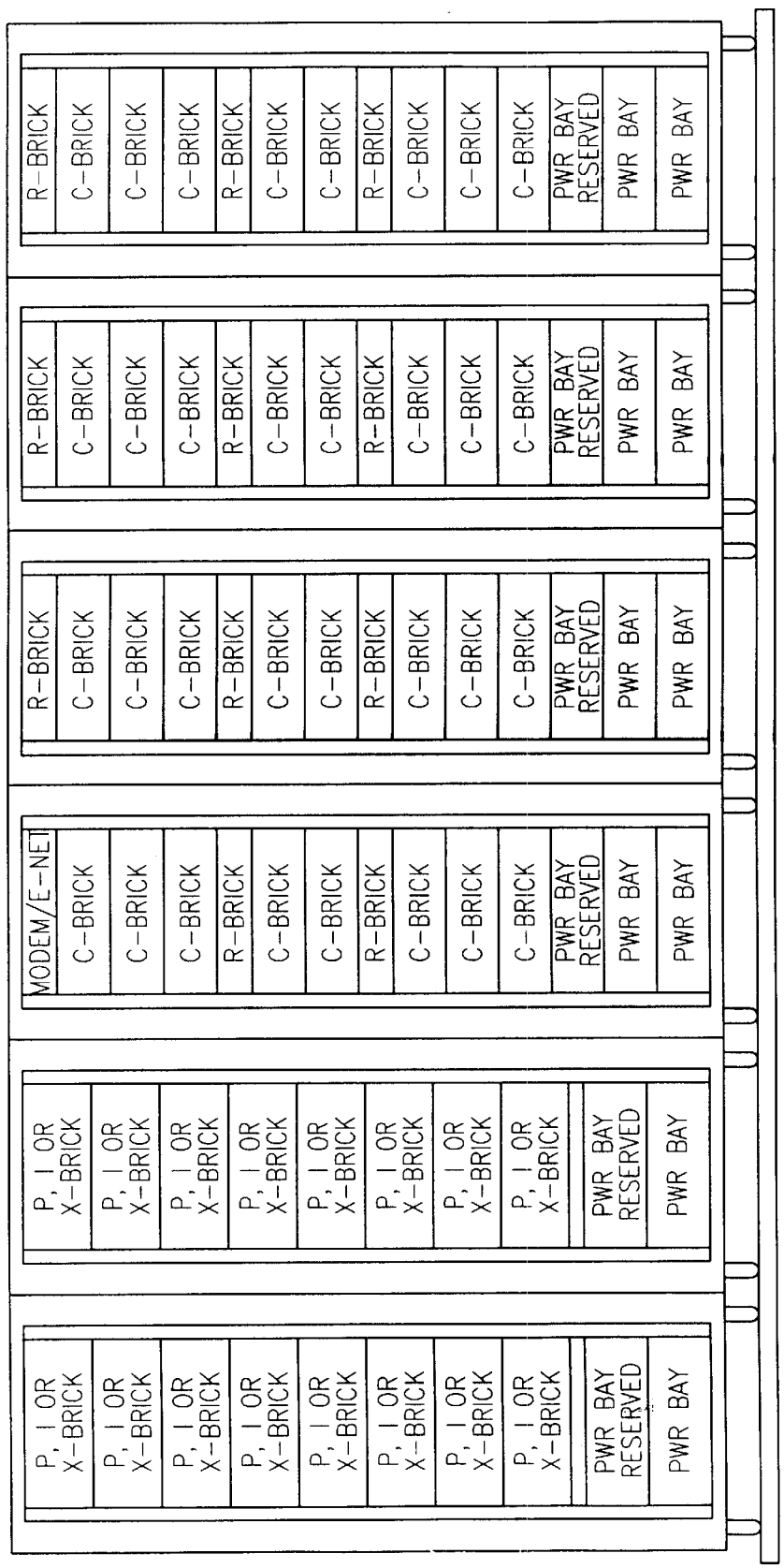
FIG. 9 is a view of an embodiment of an improved rack and scalable computer system.

FIG. 9 illustrates use of the improved rack 1000 for supporting a scalable computer system within a row of electrically connected racks 1000 with Router bricks and C-Bricks co-located in a central portion of the row of racks 1000 and centrally located in each rack 1000. In one embodiment, the racks 1000 are electrically connected. In one embodiment, the racks 1000 are mechanically connected. In various embodiments, the rack 1000 can include the additional features described.

Figure 10:
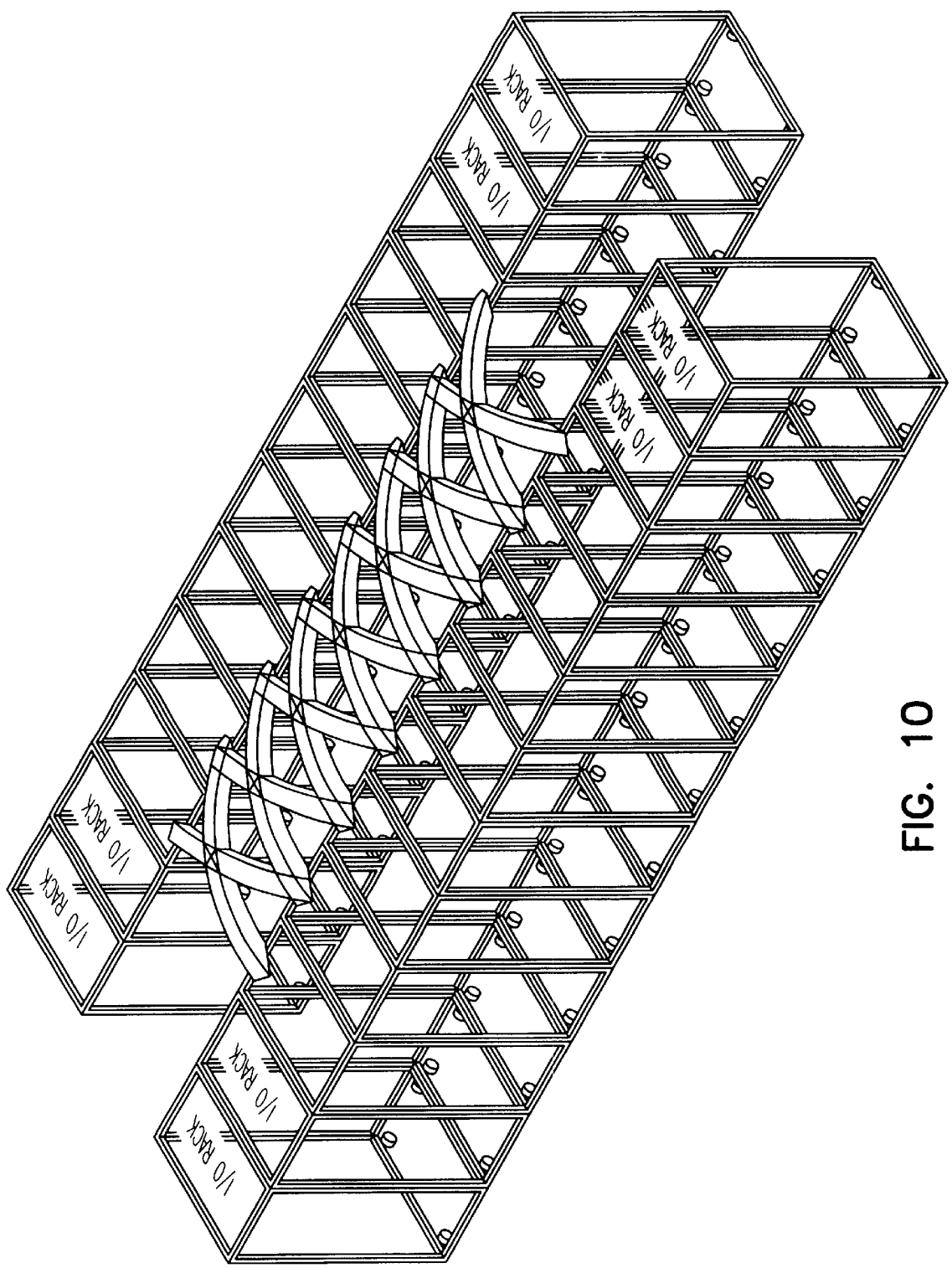
FIG. 10 is a top view of an embodiment of a configuration of a series of racks for a scalable computer system.

FIG. 10A and 10B illustrate use of the improved rack 1000 for supporting a scalable computer system within substantially parallel rows of racks 1000 with Router bricks and C-Bricks co-located in a central portion of the row of racks 1000 and centrally located in each rack 1000. FIG. 10A is a quadrant view of the computer and rack 1000 system. FIG. 10B illustrates one embodiment of a top view. In on embodiment, rows of racks 1000 are placed back to back with the Router bricks and C-Bricks co-located in a central portion of each row of rack 1000 and centrally located in each rack 1000. In one embodiment, the racks 1000 are electrically connected. In one embodiment, the racks 1000 are mechanically connected. In one embodiment, cable connections between routers in each row are made by routing of the cables through a top passage 1730 in the rear portion 1300 of the rack 1000. In one embodiment, an upper support is used to define the path of the cable and to provide grounding protection. In various embodiments, the rack 1000 can include the additional features described.

In one embodiment, the rack 1000 is suitable for supporting computer modules 30 having a proportionality described as 1 unit, 2 unit, 3 unit, 3.5 unit and 4 unit sizes. The 1 unit size simply being half the height of the 2 unit size and so on. The rack 1000 for supporting computer modules of this size has a 39 unit proportional height. Alternatively, the rack 1000 for supporting computer modules of this size has a 17 unit proportional height.

In another embodiment, computer modules having these proportions include the following modules or "bricks": System Controller, Modem/E-Net, D-Brick, P-Brick, I-Brick, X-Brick, R-Brick, C-Brick, Power Bay, as well as the Power Distribution Unit. FIG. Q illustrates an embodiment of the proportion of each brick provided as: 1 unit System Controller, 2 unit Modem/E-Net, 3.5 unit D-Brick, 4 unit P-Brick, 4 unit I-Brick, 4 unit X-Brick, 2 unit R-Brick, 3 unit C-Brick, 3 unit Power Bay, as well as the Power Distribution Unit. Use of these proportions for these specific computer modules within a 39 unit rack 1000 or 17 unit rack 1000 provides a certain minimum system scalability.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

The features of the embodiments described provide a computer rack 1000 suitable for use in building a scalable computer system. The features described improve the serviceability, upgradeability and scalability of the computer system.

What is claimed is:

1. A rack for a scalable computer system, comprising:
   a pair of vertically oriented rails for supporting a computer module; and
   a grounding element electrically coupled to the rack and positioned to provices a path to ground, wherein the grounding element is arcuate bracket attached to one of pair of rails, wherein the arcuate bracket makes contact with a side of a computer module inserted in the rack.

2. A rack for a scalable computer system, comprising:
   a pair of vertically oriented rails for supporting a computer module; and
   a grounding element electrically coupled to the rack and positioned to electrically contact a computer module inserted in the rack such that the grounding element provides a path to ground, wherein the grounding element is a conductor extending from the rack portion, and positioned to make contact with a side of a computer module inserted in the rack.

3. A rack for a scalable computer system, comprising:
   a pair of vertically oriented rails for supporting a computer module; and
   a grounding element electrically coupled to the rack and positioned to electrically contact a computer module inserted in the rack such that the grounding element provides a path to ground, wherein the grounding element is a bracket having a conductive spring element, wherein the conductive spring element maintains a spring force against a side of a computer module inserted in the rack.

4. The rack of claim 3 wherein the bracket is connected to the rail and secures placement of the computer module within the rack.

5. A rack for a scalable computer system, comprising:
   a rail for supporting a computer module; and
   a grounding structure electrically coupled to the rack and positioned to electrically contact an adjacent rack such that the grounding structure provides a path to ground, wherein the grounding structure is a conductive material extending along a side of the rack.

6. The rack of claim 5, wherein the grounding structure runs vertically along the length of the rack.

7. The rack of claim 5, wherein the grounding structure also is used to mechanically couple the rack to a second rack.

8. The rack of claim 5, wherein the rack further comprises:
   a first series of apertures included on the rack for use in adjustably mounting computer modules within the rack; and
   a second series of apertures, proximal the first series of apertures, for mounting a service module to the rack.

9. A scalable computer system, comprising:
   a rack, wherein the rack includes a vertically oriented rail and a grounding element attached to the rail, wherein the grounding element is electrically coupled to the rack through the rail; and
   a computer element mounted on the rail, wherein the computer element includes an enclosure;

wherein the grounding element is positioned to contact the computer element such that a ground path is established from the enclosure to the rack, wherein the grounding element is an arcuate bracket attached to the rail, wherein the arcuate bracket makes contact with the enclosure when the computer module is inserted in the rack.

10. A scalable computer system, comprising:

a rack, wherein the rack includes a vertically oriented rail and a grounding element attached to the rail, wherein the grounding element is electrically coupled to the rack through the rail; and a computer element mounted on the rail, wherein the computer element includes an enclosure;

wherein the grounding element is positioned to contact the computer element such that a ground path is established from the enclosure to the rack, wherein the grounding element is a conductor extending from the rack portion, and positioned to make a contact with the enclosure when the computer module is inserted in the rack.

11. A scalable computer system, comprising:

a rack, wherein the rack includes a vertically oriented rail and a grounding element attached to the rail, wherein the grounding element is electrically coupled to the rack through the rail; and a computer element mounted on the rail, wherein the computer element includes an enclosure;

wherein the grounding element is positioned to contact the computer element such that a ground path is established from the enclosure to the rack, wherein the grounding element is a bracket having a conductive spring element, wherein the conductive spring element maintains a spring force against the enclosure when the computer module is inserted in the rack.

12. The computer system of claim 11, wherein the bracket secures placement of the computer module within the rack.

13. A scalable computer system, comprising:

a rack, wherein the rack includes a vertically oriented rail and a grounding element attached to the rail, wherein the grounding element is electrically coupled to the rack through the rail; and a computer element mounted on the rail, wherein the computer element includes an enclosure;

wherein the grounding element is positioned to contact the computer element such that a ground path is established from the enclosure to the rack, is wherein the grounding element comprises a bracket which includes a fastener for engaging a portion of the enclosure.

14. The computer system of claim 13, wherein the bracket includes a portion having at least one aperture for aligning with a period of the rack having an aperture for use in fastening the bracket to the rack.

15. The computer system of claim 13, wherein the bracket includes at least one threaded aperture for use in fastening the bracket to a portion of the rack.

16. A scalable computer system, comprising:

a rack, wherein the rack includes a vertically oriented rail and a grounding element attached to the rail, wherein the grounding element is electrically coupled to the rack through the rail; and a computer element mounted on the rail, wherein the computer element includes an enclosure;

wherein the grounding element is positioned to contact the computer element such that a ground path is established from the enclosure to the rack, wherein the grounding element includes a bracket and an arcuate portion extending over the bracket and having a free end such that the arcuate portion is capable of deforming when in contact with the computer module, the arcuate portion for maintaining a spring forced to maintain contact with the enclosure of the computer module.

17. The computer system of claim 16, wherein the arcuate portion is comprised of separate tongs having an arcuate shape.

18. A scalable computer system, comprising:

a first and second rack, wherein each rack includes a rail; and first and second computer elements mounted on the rail of the first and second rack, respectively, wherein each computer element includes an enclosure;

wherein each rack includes a grounding structure electrically coupled to the rack and positioned to electrically contact an adjacent rack such that the grounding structure provides a path to ground, wherein the grounding structure is a conductive material extending along a side of the rack and acting to mechanically couple the first rack to the second rack.

19. The system of claim 18, wherein each rack further includes a grounding element attached to the rail, wherein the grounding element is electrically coupled to the rack through the rail and wherein the grounding element is positioned to contact the computer element mounted on the rail such that a ground path is established from the enclosure to the rack.

20. The system of claim 18, wherein each rack further includes a first and second router brick, wherein the router bricks are are located proximal one another in order to minimize the length of a cable connection from the first router brick to the second router brick.

21. The system of claim 20, wherein the cable connection length is less than about 1 meter.

22. A rack for a scalable computer system comprising:

a rack for supporting at least one computer module, wherein the rack includes a wider section which provides a cabling channel; and a feature on the rack for mechanically coupling the rack to an adjacent rack.

23. A computer rack for a scalable computer system, comprising:

at least one passage for allowing a cable to pass through the rack to an adjacent rack; and a cable organizer for maintaining placement of at least one cable routed.

24. A support bracket for supporting a computer component within a computer rack, the bracket comprising:

a front surface including a portion having holes with threads; the holes with threads on the front surface for engaging a fastener inserted through a portion of the rack;

a rear surface including a portion having holes with threads; the holes with threads on the rear surface for engaging a fastener inserted through a portion of the rack;

a support portion between the front surface and rear surface for supporting a computer component; and a side portion, the side portion having a mechanism for coupling the side portion to the rack, wherein the mechanism for coupling the side portion to the rack includes tabs for engaging a portion of a series of side apertures in the rack.

25. The support bracket of claim 21 wherein the bracket is vertically adjustable in the rack.

26. The support bracket of claim 24, wherein the front surface defines a first plane and the rear surface defines a second plane and the first and second planes are substantially parallel to each other.

27. A bracket for providing an electrical path from the computer component to a computer rack comprising:
   a first conductive surface including:
      a series of apertures suitable for use in mounting the bracket to a computer rack; and
   a second conductive surface extending from the first conductive surface at about a 90 degree angle from the first surface, the second surface having:
      an arcuate portion; and
      a free end, such that the arcuate portion is capable of deforming when contacting a computer component;
   the bracket providing an electrical path from the computer component to the rack.

28. A bracket comprising:
   a first surface for coupling to a rack;
   a portion positioned proximal a computer component, the portion positioned proximal the computer component including a rotatable fastening mechanism for coupling to the computer component.

29. A rack for a scalable computer system, comprising:
   a rail for supporting a computer module; and
   a grounding structure electrically coupled to the rack and positioned to electrically contact an adjacent rack such that the grounding structure provides a path to ground, wherein the grounding structure is a conductive material extending along a side of the rack, wherein the grounding structure also is used to mechanically couple the rack to an adjacent rack.

30. The rack of claim 29, wherein the grounding structure runs vertically along the length of the rack.

31. A rack for a scalable computer system, comprising:
   a rail for supporting a computer module;
   a grounding structure electrically coupled to the rack and positioned to electrically contact an adjacent rack such that the grounding structure provides a path to ground, wherein the grounding structure is a conductive material extending along a side of the rack;
   a first series of ⅞" apertures included on the rack for use in adjustably mounting computer modules within the rack; and
   a second series of apertures, proximal the first series of ⅞" apertures, for mounting a service module to the rack.

32. The rack of claim 31, wherein the grounding structure also is used to mechanically couple the rack to a second rack.

33. A scalable computer system, comprising:
   a rack, wherein the rack includes a rail and a grounding element attached to the rail, wherein the grounding element is electrically coupled to the rack through the rail; and
   a computer element mounted on the rail, wherein the computer element includes an enclosure;
   wherein the grounding element is positioned to contact the computer element such that a ground path is established from the enclosure to the rack,
   wherein the grounding element is a bracket having a conductive spring element, wherein the conductive spring element maintains a spring force against the enclosure when the computer module is inserted in the rack, wherein the bracket includes a fastener for engaging a portion of the enclosure.

34. A scalable computer system, comprising:
   a rack, wherein the rack includes a rail and a grounding element attached to the rail, wherein the grounding element is electrically coupled to the rack through the rail; and
   a computer element mounted on the rail, wherein the computer element includes an enclosure;
   wherein the grounding element is positioned to contact the computer element such that a ground path is established from the enclosure to the rack,
   wherein the grounding element is a bracket having a conductive spring element, wherein the conductive spring element maintains a spring force against the enclosure when the computer element is inserted in the rack, wherein the bracket includes a portion having at least one aperture for aligning with a portion of the rack having an aperture for use in fastening the bracket to the rack.

35. A scalable computer system, comprising:
   a rack, wherein the rack includes a rail and a grounding element attached to the rail, wherein the grounding element is electrically coupled to the rack through the rail; and
   a computer element mounted on the rail, wherein the computer element includes an enclosure;
   wherein the grounding element is positioned to contact the computer element such that a ground path is established from the enclosure to the rack,
   wherein the grounding element is a bracket having a conductive spring element, wherein the conductive spring element maintains a spring force against the enclosure when the computer element is inserted in the rack, wherein the bracket includes at least one threaded aperture for use in fastening the bracket to a portion of the rack.

36. A support bracket for supporting a computer component within a computer rack, the bracket comprising:
   a front surface including a portion having holes with threads; the holes with threads on the front surface for engaging a fastener inserted through a portion of the rack;
   a rear surface including a portion having holes with threads; the holes with threads on the rear surface for engaging a fastener inserted through a portion of the rack;
   a support portion between the front surface and rear surface for supporting a computer component; and
   a side portion, the side portion having a mechanism for coupling the side portion to the rack, the side portion including an aperture proximal the front of the rack, a push pin inserted through the aperture proximal the front of the rack for engaging a portion of a series of side apertures, the push pin being removable, wherein the side portion further includes an aperture proximal the rear of the rack, a second push pin inserted through the aperture proximal the rear of the rack for engaging a portion of a series of side apertures, the second push pin being removable.

37. The support bracket of claim 36 wherein the bracket is vertically adjustable in the rack.

* * * * *

UNITED STATES PATENT AND TRADEMARK OFFICE
CERTIFICATE OF CORRECTION

PATENT NO. : 6,452,805 B1  Page 1 of 1
DATED : September 17, 2002
INVENTOR(S) : Perry D. Franz et al.

Figure 2E:
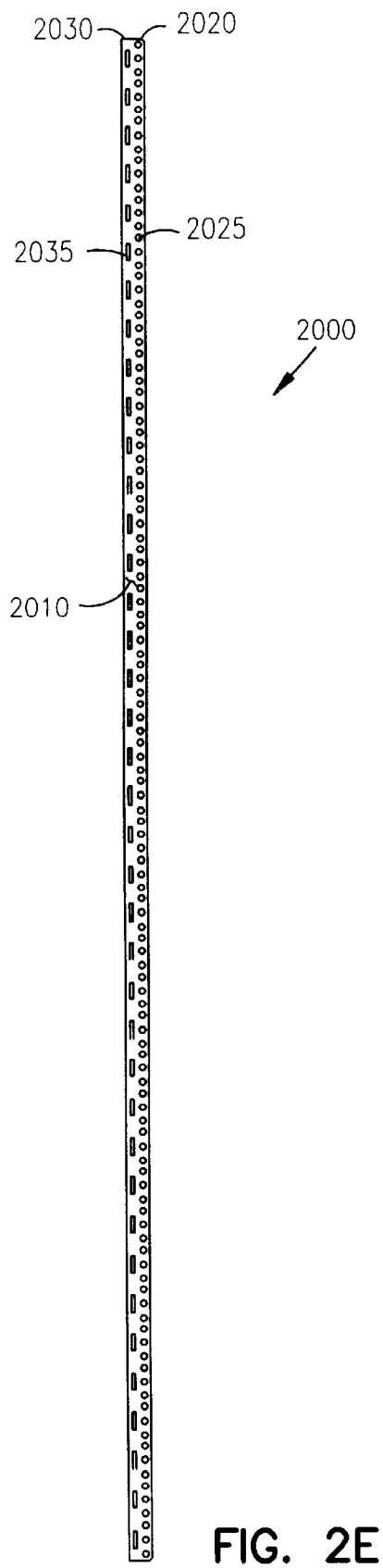
FIG. 2e is a side view of a first side of a rail according to one embodiment.
Figure 2F:
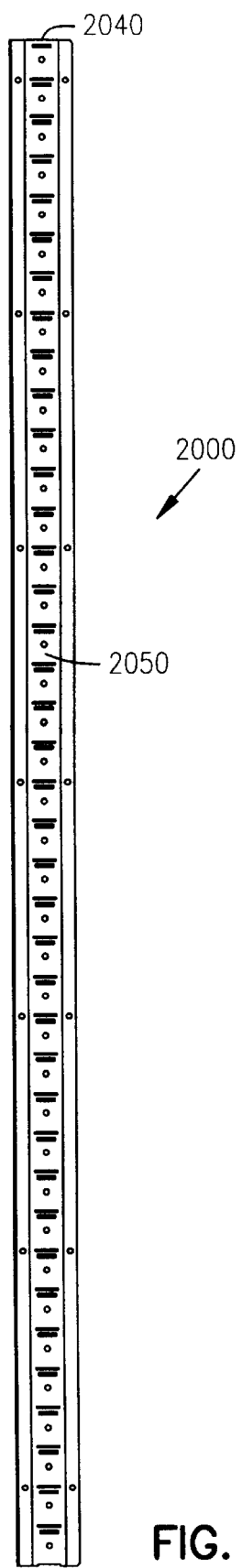
FIG. 2f is a side view of a second side of the rail of FIG. 23.
Figure 2G:
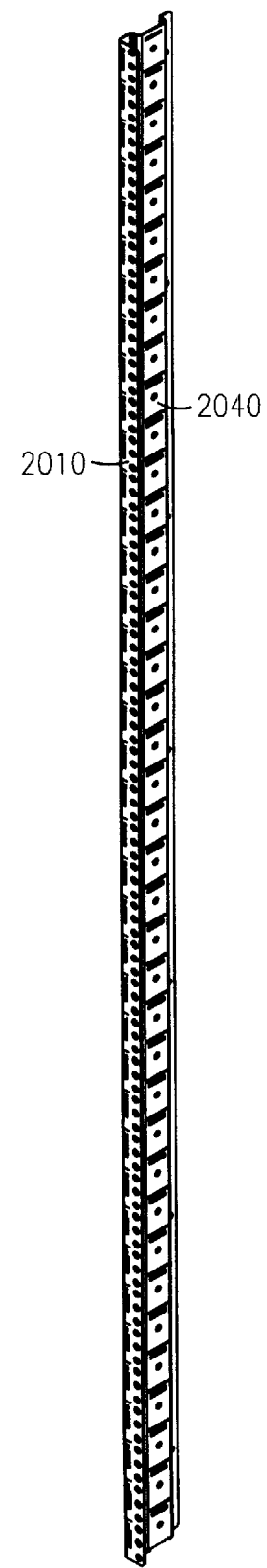
FIG. 2g is a perspective view of the rail of FIG. 23.

It is certified that error appears in the above-identified patent and that said Letters Patent is hereby corrected as shown below:

Column 2,
Lines 61 and 62, delete "FIG. 2*3*" and insert -- FIG. 2*e* --, therefor.

Column 12,
Line 13, insert -- electrically contact a computer module inserted in the rack such that the grounding element -- after "positioned to".
Line 13, delete "provices" and insert -- provides --, therefor.

Column 13,
Line 49, delete "is" before "wherein".

Column 14,
Line 35, delete second instance of "are" after "bricks".
Line 51, insert -- through the passage -- after "routed".

Column 15,
Line 3, delete "claim *21*" and insert -- claim *24* --, therefor.

Signed and Sealed this

First Day of April, 2003

JAMES E. ROGAN
*Director of the United States Patent and Trademark Office*